(12) United States Patent
Kwon et al.

(10) Patent No.: US 7,395,192 B2
(45) Date of Patent: Jul. 1, 2008

(54) METHOD FOR CONVERTING IBIS MODEL TO SPICE BEHAVIORAL MODEL BY EXTRACTING RESISTOR AND CAPACITOR

(75) Inventors: Won Ok Kwon, Daejeon (KR); Kyoung Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 312 days.

(21) Appl. No.: 11/243,590

(22) Filed: Oct. 5, 2005

(65) Prior Publication Data

US 2006/0224374 A1    Oct. 5, 2006

(30) Foreign Application Priority Data

Mar. 31, 2005    (KR) ...................... 10-2005-0026921

(51) Int. Cl.
*G06F 17/10* (2006.01)
*G06F 17/50* (2006.01)
(52) U.S. Cl. ........................................... 703/2; 703/14
(58) Field of Classification Search ............. 703/13–15, 703/2
See application file for complete search history.

(56) References Cited

U.S. PATENT DOCUMENTS

| 6,212,490 | B1 * | 4/2001 | Li et al. ........................ 703/14 |
| 6,292,766 | B1 | 9/2001 | Mattos et al. |
| 6,820,046 | B1 * | 11/2004 | Lamson et al. ................. 703/14 |
| 7,136,797 | B2 * | 11/2006 | Tosaka et al. .................. 703/14 |

OTHER PUBLICATIONS

Varma et al., A. Simultaneous Switching Noise in IBIS Models, 2004 Int. Symposium on Electromagnetic Compatibility, IEEE, Aug. 2004, pp. 1000-1004.*
Varma et al., A. The Development of a Macro-Modeling Tool to Develop IBIS Models, IEEE, Electrical Performance of Electronic Packaging, Oct. 2003, pp. 277-280.*
Van Nieuwpoort et al., R. Ibis: An Efficient Java-Based Grid Programming Environment, Proceedings of the 2002 Joint ACM-ISCOPE Conf. on Java Grande JGI '02, Nov. 2002, pp. 18-27.*
Ketcham et al., M. Integrating IBIS Simulations and Systems Planning Models Through Multiple Model Communications, Proceedings of the 21st Conf. on Winter Simulation WSC '89, Oct. 1989, pp. 834-839.*
'Extraction of Transient Behavorial Model of Digital I/O Buffers from IBIS' Tehrani et al., 1996 Electronic Components and Technology Conference, pp. 1009-1015.
'The Development of Analog SPICE Behavioral Model Based on IBIS Model' Wang et al., School of EEE, Nanyang Technological University, Singapore, date unavailable, pp. 1-4.

* cited by examiner

*Primary Examiner*—Russell Frejd
(74) *Attorney, Agent, or Firm*—Ladas & Parry LLP

(57) ABSTRACT

A method for converting an IBIS (Input/output Buffer Information Specification) model to a SPICE (Simulation Program with Integrated Circuit Emphasis) behavioral model by RC (resistor/capacitor) extraction is provided. In the method, when the SPICE behavioral models of pull-up and pull-down transistors being switching components of the output IBIS model is embodied, a resistance is extracted from voltage-current tables of the pull-up and pull-down transistors and a capacitance is extracted from voltage-time tables of the pull-up and pull-down transistors so that a static characteristic is modeled as a resistor and a dynamic characteristic is modeled as a capacitor.

4 Claims, 6 Drawing Sheets

METHOD FOR CONVERTING IBIS MODEL TO SPICE BEHAVIORAL MODEL BY EXTRACTING RESISTOR AND CAPACITOR

BACKGROUND OF THE INVENTION

1. Field of the Invention

The present invention relates to a method for converting an IBIS model to a SPICE behavioral model by extracting a resistor and a capacitor, and more particularly, to a method for converting an IBIS model to a SPICE behavioral model by extracting a resistor and a capacitor, for converting an Input/output Buffer Information Specification (IBIS) model provided as a behavioral model of an input/output pin of an integrated circuit, to a SPICE (Simulation Program with Integrated Circuit Emphasis) behavioral model.

2. Description of the Related Art

IBIS model refers to a digital input/output (I/O) model for fast signal integrity analysis of such as a transmission line effect, a crosstalk phenomenon, and a ringing phenomenon on printed circuit boards resulting from a high frequency signal as a clock speed of a digital integrated circuit is increased.

The IBIS model provides voltage-current (VI) and voltage-time (VT) information of a digital input/output pin in a format of table, and describes characteristics of a packaging parasitic component and an electrostatic discharge (ESD) prevention circuit. The IBIS behavioral model has a greater speed of simulation execution, owing to its VI and VT information provided in the format of table, than a SPICE model where a current value and a voltage value should be extracted at each node. The IBIS behavioral model is useful for a system level designer owing to its advantage of keeping a secret of an intellectual property (IP) of a circuit. However, it is required to convert the IBIS model to the SPICE behavioral model since the IBIS model has a limitation of various load simulation execution.

Then, a conventional technology for converting the IBIS model to the SPICE behavioral model will be described.

FIG. 1 is a flowchart illustrating a sequence of extracting a SPICE behavioral model from an IBIS model, for verification.

The IBIS model is largely divided into an input pin model and an output pin model. As shown in FIG. 1, an input pin SPICE model 105 can be simply provided using only DC VI table information 103 provided from the IBIS model 102, but an output pin SPICE model 106 needs a process of extracting a switching time coefficient 104 due to a switching characteristic. In this case, a VT table value 103 provided from the IBIS model 102 is used. The SPICE behavioral model generated from the IBIS model performs simulation 107 in the substantially same load condition as the SPICE model 101, and determines its simulation accuracy depending on whether two simulation results have a similar characteristic to any degree.

FIG. 2A illustrates the SPICE behavioral model of the IBIS model for an input pin. In the IBIS model, packaging components (C_pkg 201, L_pkg 202, and R_pkg 203) and a pad capacitor (C_comp 206) are provided as values, and a power clamp (POWER_clamp) and a ground clamp (GND_clamp) being ESD diodes 204 and 205 are provided as DC VI tables. The SPICE behavioral model of the IBIS model for the input pin is expressed as shown in FIG. 2B. The VI tables of the ESD diodes 204 and 205 are expressed as voltage controlled current sources (VCCS) 207 and 208 of the SPICE behavioral model.

The SPICE behavioral model of the IBIS model for an output pin is shown in FIG. 3. Packaging parasitic components (L_pkg 306, R_pkg 307, and C_pkg 308) and a pad capacitor (C_comp 305), and a power clamp (POWER_clamp) and a ground clamp (GND_clamp) being ESD diodes 303 and 304 are the same as those of the input model, and pull-up and pull-down transistors 301 and 302 are additionally provided. The IBIS model includes VI tables 310, 311 and 312 being static characteristics of the pull-up and pull-down transistors 301 and 302; and a VT table 313 being a dynamic characteristic. Reference numerals 314 and 315 denote a fixture resistance (R_fix) and a fixture voltage (V_fix), respectively.

In order to embody an accurate output SPICE behavioral model, an accurate model of a switching component is required. A conventional technology adopts a method for obtaining a switching time coefficient using a circuit equation, as a switching component modeling method. According to this method, the SPICE behavioral model of the output pin is expressed as in FIG. 3C. The pull-up transistor is expressed by a multiplication 320 of a switching time coefficient (Ku(t)) and a static current ($I_{pu}(V)$), and the pull-down transistor is expressed by a multiplication 321 of a switching time coefficient (Kd(t)) and a static current ($I_{pd}(V)$). Reference numerals 322 and 323 denote DC VI tables of the diodes 303 and 304. Accordingly, a total transition current $I_{out}(t)$ is expressed as follows:

$$I_{out}(t)=Kux(t)\times I_{pu}(V_{die})+Kdx(t)\times I_{pd}(V_{die})+I_{pc}(V_{die})+I_{gc}(V_{die})$$ [Equation 1]

FIG. 3B illustrates an IBIS VT table measurement circuit. A transition current Iout(t) is expressed by the circuit equation as in the following Equation 2:

$$I_{out}(t) = -\left(C_{comp}\frac{d}{dt}V_{die}(t) + \frac{V_{die}(t) - V_{fix}}{R_{fix}}\right)$$ [Equation 2]

The switching time coefficients Ku(t) and Kd(t) are obtained by combining the Equations 1 and 2.

The above conventional technology requires two pieces of VT table information in order to obtain two switching time coefficients, and has a drawback of inaccuracy of the SPICE model including the time information in FIG. 3C. That is, the conventional art has a limitation of being capable of extraction only in an environment where two or more VT tables are given in an IBIS version 2.1 or above.

SUMMARY OF THE INVENTION

Accordingly, the present invention is directed to a method for converting an IBIS model to a SPICE behavioral model by extracting a resistor and a capacitor, which substantially obviates one or more problems due to limitations and disadvantages of the related art.

It is an object of the present invention to provide a method for converting an IBIS model to a SPICE behavioral model by extracting a resistor and a capacitor, in which, when the SPICE behavioral models of pull-up and pull-down transistors being switching components of the output IBIS model are embodied, a static characteristic is modeled as a resistor extracted from voltage-current tables of the pull-up and pull-down transistors, and a dynamic characteristic is modeled as a capacitor extracted from voltage-time tables of the pull-up and pull-down transistors.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method for converting an IBIS (Input/output Buffer Information Specification) model to a SPICE (Software Process Improvement Capability determination) behavioral model by RC (resistor/capacitor) extraction, wherein, when the SPICE behavioral models of pull-up and pull-down transistors being switching components of the output IBIS model is embodied, a resistance is extracted from voltage-current tables of the pull-up and pull-down transistors and a capacitance is extracted from voltage-time tables of the pull-up and pull-down transistors so that a static characteristic is modeled as a resistor and a dynamic characteristic is modeled as a capacitor.

The resistance is a resistance considering DC (direct current) characteristics of the pull-up and pull-down transistors.

The capacitance is obtained by dividing the resistance extracted from the voltage-current tables into a delay time, and adding a division result value to a pad capacitor value, and the delay time is obtained through multiplying an arithmetic operation of a capacitor ($C_P$), a capacitor ($C_N$), and a pad capacitor ($C_{comp}$) by the resistance extracted from the voltage-current tables, and the capacitor ($C_P$) and the capacitor ($C_N$) are connected at their one terminals to a common node of the pull-up and pull-down transistors and are connected at their other terminals to an input voltage (Vin), and the pad capacitor ($C_{comp}$) is connected at its one terminal to a common node of the capacitor ($C_P$) and the capacitor ($C_N$) and is connected at its other terminal to the ground.

The capacitance of the pull-up transistor is obtained by dividing the resistance extracted from the voltage-current table of the pull-up transistor, into the delay time, and adding the division result value to the pad capacitor value.

The capacitance of the pull-down transistor is obtained by dividing the resistance extracted from the voltage-current table of the pull-down transistor, into the delay time, and adding the division result value to the pad capacitor value.

Meantime, a power clamp diode connected at its anode to a common node of the pull-up and pull-down transistors and connected at its cathode to a voltage (Vcc), and a ground clamp diode connected at its cathode to a common node of the pull-up and pull-down transistors and connected at its anode to the ground, are expressed as a voltage controlled current source (VCCS).

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention, are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

The present invention uses a resistor and a capacitor being passive components, as a method for expressing static and dynamic characteristics of pull-up and pull-down transistors being switching components (that is, active components), as SPICE components, when an output IBIS model is converted to a SPICE behavioral model.

Figure 1:
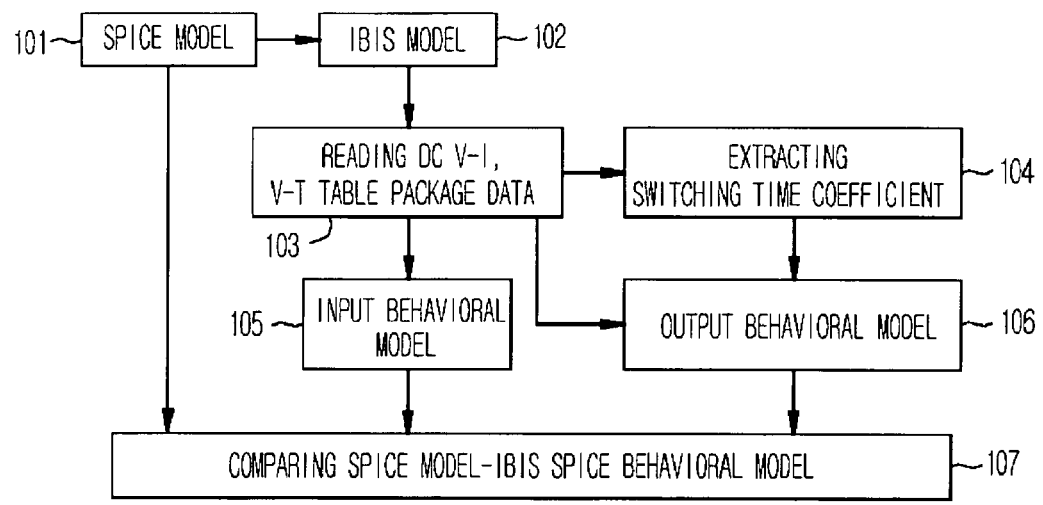
FIG. 1 is a flowchart illustrating a model verification method when an IBIS model is converted to a SPICE behavioral model.
Figure 2A:
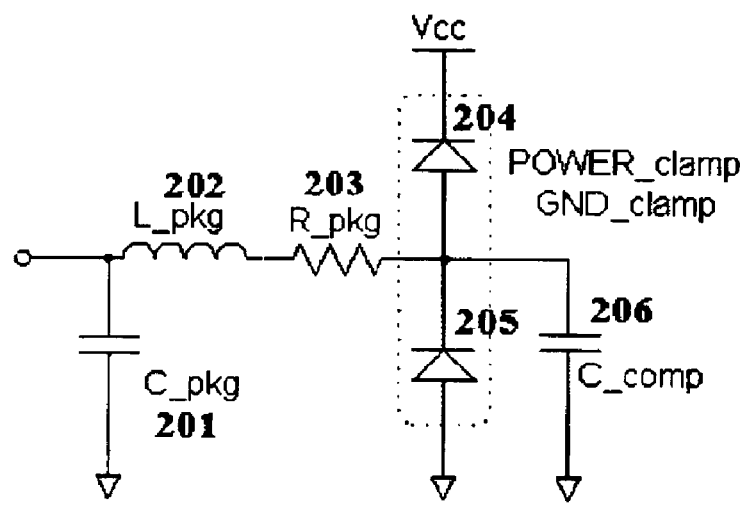
FIG. 2A illustrates an IBIS input behavioral model.
Figure 2B:
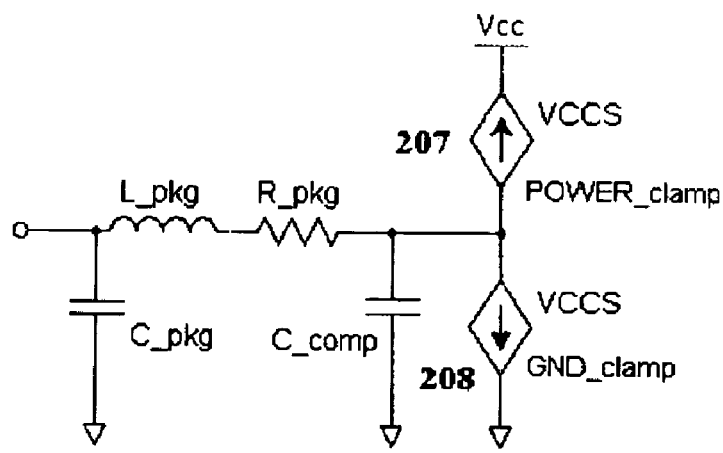
FIG. 2B illustrates an IBIS input SPICE behavioral model.
Figure 3A:
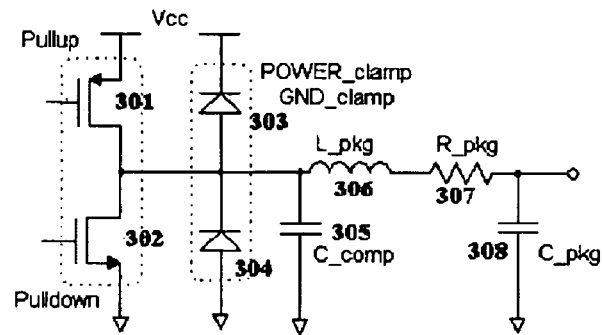
FIG. 3A illustrates an IBIS output behavioral model.
Figure 3B:
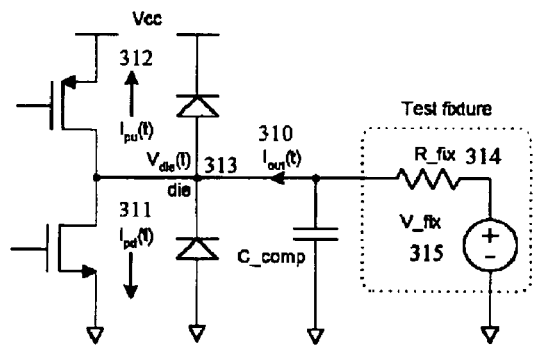
FIG. 3B illustrates an IBIS VT table measurement circuit.
Figure 3C:
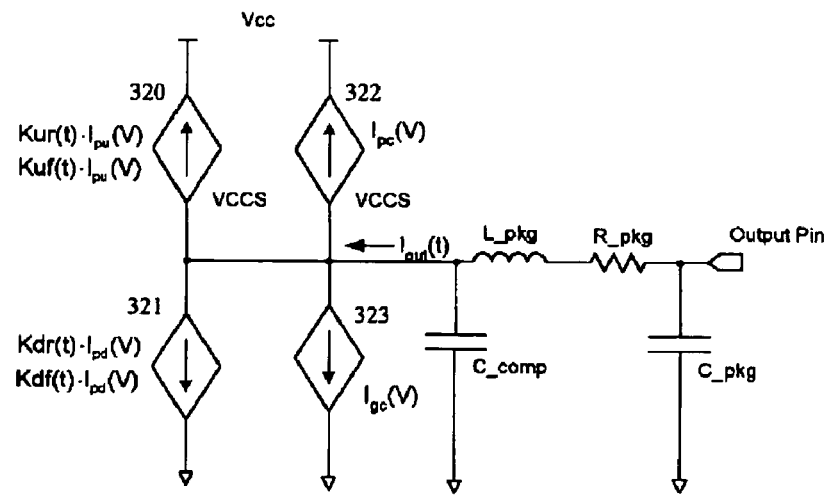
FIG. 3C illustrates an IBIS output SPICE behavioral model.
Figure 4A:
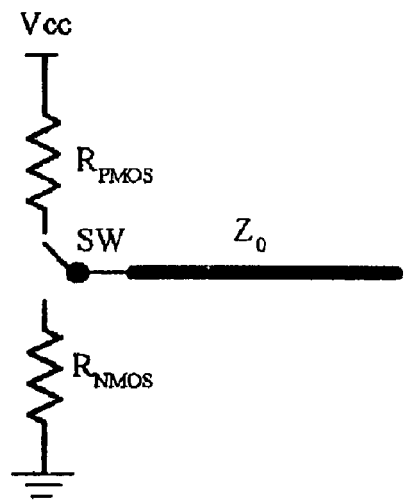
FIG. 4A illustrates pull-up and pull-down transistors modeled as resistors.
Figure 4B:
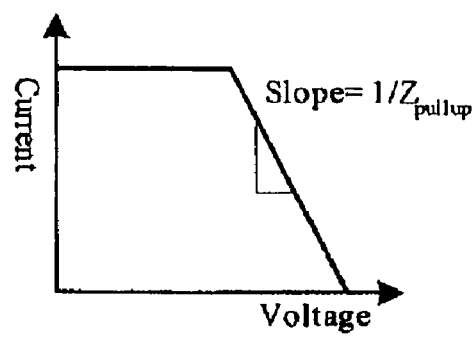
FIG. 4B illustrates a VI characteristic curve of a pull-up transistor.
Figure 4C:
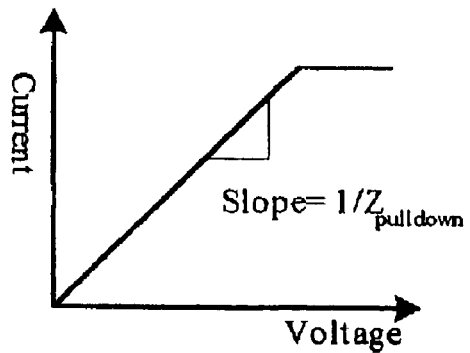
FIG. 4C illustrates a VI characteristic curve of a pull-down transistor.

FIGS. 4B and 4C illustrate voltage-current (VI) tables of the pull-up and pull-down transistors provided in the IBIS model, respectively A slope can be expressed as a resistor (resistor voltage/current), and as shown in FIG. 4C, direct current (DC) characteristics of the pull-up and pull-down transistors are modeled as resistors ($R_{PMOS}$ and $R_{NMOS}$).

A method for modeling the dynamic characteristics of the pull-up and pull-down transistors is as follows.

Figure 5A:
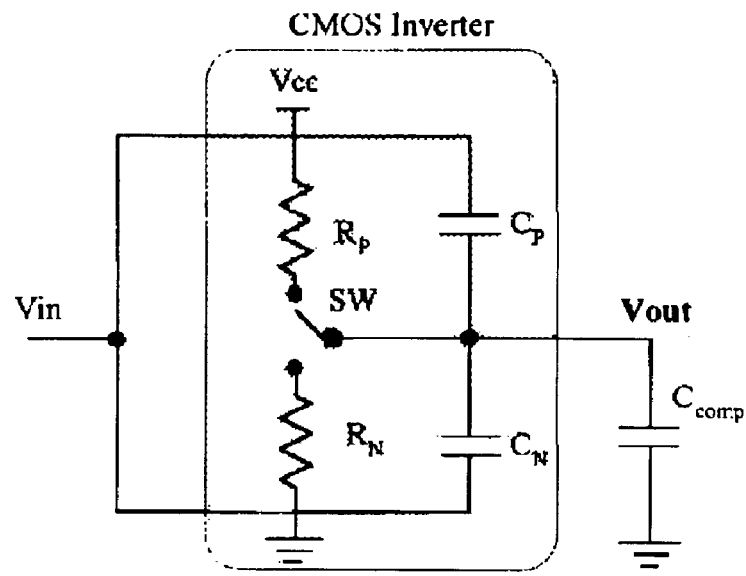
FIG. 5A illustrates a CMOS inverter comprised of a resistor and a capacitor.
Figure 5B:
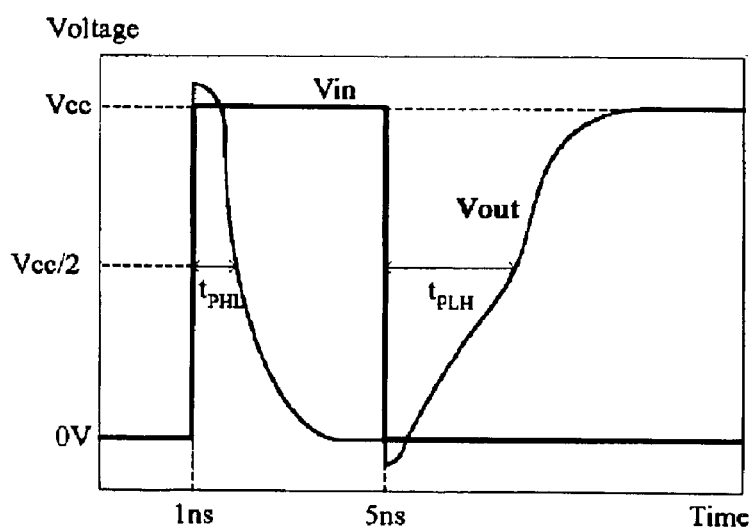
FIG. 5B illustrates an inverter switching input/output waveform.

In a circuit of FIG. 4A, that is, in models of the pull-up and pull-down transistors considering the DC characteristic, the capacitors ($C_P$ and $C_N$) are added and connected with a pad capacitor ($C_{comp}$) as shown in FIG. 5A. FIG. 5B illustrates a waveform of an output voltage (Vout) for an input voltage (Vin). In case of all of the pull-up and pull-down transistors, a half point (Vcc/2) of the output voltage where switching occurs is positioned in a saturation region. A high-to-low switching delay time ($t_{PHL}$) is obtained from a falling voltage-time (VT) table of the IBIS model by multiplying an equivalent resistance ($R_N$) of the pull-down transistor with a load capacitance. A low-to-high switching delay time ($t_{PLH}$) is obtained from a rising VT table of the IBIS model by multiplying an equivalent resistance ($R_P$) of the pull-up transistor with a load capacitance.

Figure 6:
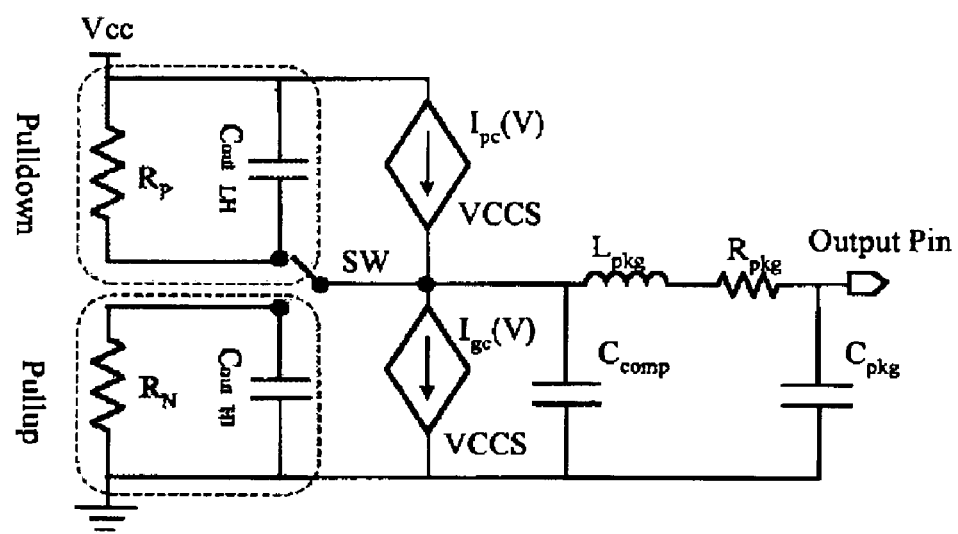
FIG. 6 illustrates a SPICE behavioral model of an output IBIS model in which pull-up and pull-down transistors are modeled as a resistor and a capacitor.

By applying a resistor/capacitor (RC) extraction method of FIGS. 4 and 5, the SPICE behavioral model of the output IBIS model where the pull-up and pull-down transistors are modeled as the RC is formed as shown in FIG. 6. A high-to-low capacitor (Cout_HL) and a low-to-high capacitor (Cout_LH) unknown can be obtained through Equations 3 and 4:

$$t_{PHL} = R_N \cdot C_{LOAD1} = R_N \cdot (C_{out\_HL} + C_{comp}) \quad \text{[Equation 3]}$$

$$t_{PLH} = R_P \cdot C_{LOAD2} = R_P \cdot (C_{out\_LH} + C_{comp}) \quad \text{[Equation 4]}$$

As such, the IBIS model being the input/output model of an integrated circuit chip provides a modeling algorithm for the resistors/capacitors (RC) of the pull-up and pull-down transistors of an output buffer. The static characteristic of the transistor is expressed as the resistor, and a transition characteristic is expressed as the capacitor. The resistance uses the VI and VT tables of the pull-up and pull-down transistors provided from the IBIS model. The present algorithm is a universal IBIS to SPICE behavioral model converting algorithm considering a switching characteristic and being accurate and applicable to all IBIS versions.

As described above, in the inventive method for converting the IBIS model to the SPICE behavioral model by the RC extraction, the modeling algorithm of the resistors/capacitors (RC) of the pull-up and pull-down transistors of the output buffer can be provided from the IBIS model being the input/output model of the integrated circuit chip generally provided by semiconductor vendors, thereby creating the output SPICE behavioral model more universal and accurate than a conventional switching time coefficient extraction method using the circuit equation.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for converting an IBIS (Input/output Buffer Information Specification) model to a SPICE (Simulation Program with Integrated Circuit Emphasis) behavioral model by RC (resistor/capacitor) extraction, the method comprising:

obtaining data measured from a device or simulated as being representative of a device for modeling the electrical behavior of the device, wherein the SPICE behavioral models of pull-up and pull-down transistors are switching components of the output IBIS model, the data comprising:

voltage-current tables of pull-up and pull-down resistors of the device;

voltage-time tables of the pull-up and pull-down resistors of the device; and a pinout of the device and a pin-to-buffer mapping of the device;

determining a resistance from the voltage-current tables of the pull-up and pull-down transistors;

determining capacitance from the voltage-time tables of the pull-up and pull-down transistors;

modeling a static characteristic as a resistor; and modeling a dynamic characteristic as a capacitor, wherein the SPICE behavioral model converted from the IBIS model is applicable for load simulation executions so as to provide a universal IBIS to SPICE behavioral model, wherein the capacitance is obtained by dividing the resistance extracted from the voltage-current tables into a delay time, and adding a division result value to a pad capacitor value, and the delay time is obtained through multiplying an arithmetic operation of a capacitor ($C_P$), a capacitor ($C_N$), and a pad capacitor ($C_{comp}$) by the resistance extracted from the voltage-current tables, and wherein the capacitor ($C_P$) and the capacitor ($C_N$) are connected at their first terminals to a common node of the pull-up and pull-down transistors and are connected at their second terminals to an input voltage (Vin), and the pad capacitor ($C_{comp}$) is connected at its one terminal to a common node of the capacitor ($C_P$) and the capacitor ($C_N$) and is connected at its other terminal to the ground.

2. The method of claim 1, wherein saturation region voltages of the pull-up and pull-down transistors are set to a half (Vcc/2) of an output maximal voltage (Vcc).

3. The method of claim 1, wherein the capacitance of the pull-up transistor is obtained by dividing the resistance extracted from the voltage-current table of the pull-up transistor, into the delay time, and adding the division result value to the pad capacitor value.

4. The method of claim 1, wherein the capacitance of the pull-down transistor is obtained by dividing the resistance extracted from the voltage-current table of the pull-down transistor, into the delay time, and adding the division result value to the pad capacitor value.

* * * * *